(12) United States Patent
Hung et al.

(10) Patent No.: US 9,209,521 B2
(45) Date of Patent: Dec. 8, 2015

(54) ON-CHIP HELIX ANTENNA

(75) Inventors: Cheng-Hsien Hung, Taoyuan (TW);
Yu-Ling Lin, Taipei (TW); Ho-Hsiang Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 1265 days.

(21) Appl. No.: 12/904,692

(22) Filed: Oct. 14, 2010

(65) Prior Publication Data

US 2012/0092230 A1 Apr. 19, 2012

(51) Int. Cl.
*H01Q 1/36* (2006.01)
*H01Q 1/38* (2006.01)
*H01Q 11/08* (2006.01)
*H01Q 23/00* (2006.01)

(52) U.S. Cl.
CPC ................. *H01Q 11/08* (2013.01); *H01Q 1/36* (2013.01); *H01Q 1/38* (2013.01); *H01Q 23/00* (2013.01)

(58) Field of Classification Search
CPC ........... H01Q 1/36; H01Q 1/362; H01Q 1/24; H01Q 1/241; H01Q 1/242; H01Q 1/243; H01Q 11/08; H01Q 1/38; H01Q 13/00; H01Q 13/02

USPC .......................................... 343/895, 700 MS
See application file for complete search history.

(56) References Cited

U.S. PATENT DOCUMENTS

| | | | |
|---|---|---|---|
| 5,699,072 A * | 12/1997 | Tokuda et al. | 343/786 |
| 5,909,198 A * | 6/1999 | Mandai et al. | 343/895 |
| 6,271,802 B1 * | 8/2001 | Clark et al. | 343/895 |
| 6,650,303 B2 * | 11/2003 | Kim et al. | 343/895 |
| 6,862,002 B2 * | 3/2005 | Demicco et al. | 343/846 |
| 7,324,063 B2 | 1/2008 | Bae et al. | |
| 7,605,760 B2 * | 10/2009 | Kim et al. | 343/700 MS |
| 7,944,404 B2 * | 5/2011 | Yun et al. | 343/895 |
| 2001/0043161 A1 * | 11/2001 | Tseng et al. | 343/895 |
| 2005/0035924 A1 * | 2/2005 | Liu et al. | 343/895 |
| 2011/0241959 A1 * | 10/2011 | Georgescu et al. | 343/793 |

* cited by examiner

*Primary Examiner* — Dameon E Levi
*Assistant Examiner* — Jennifer F Hu
(74) *Attorney, Agent, or Firm* — Hauptman Ham, LLP

(57) ABSTRACT

A rectangular helix antenna in an integrated circuit includes upper electrodes disposed in a first metal layer, lower electrodes disposed in a second metal layer, and side electrodes connecting the upper electrodes with the lower electrodes, respectively. The upper electrodes are disposed at an angle with respect to the lower electrodes. The upper electrodes, the lower electrodes, and the side electrodes form one continuous electrode spiraling around an inner shape of a rectangular bar. A micro-electromechanical system (MEMS) helix antenna has a similar structure to the rectangular helix antenna, but can have an inner shape of a bar.

20 Claims, 6 Drawing Sheets

ON-CHIP HELIX ANTENNA

TECHNICAL FIELD

The present disclosure relates generally to an antenna and more particularly an on-chip helix antenna.

BACKGROUND

For system-on-chip (SOC) applications, on-chip antenna helps integration and keeps the cost down, e.g., for millimeter wave wireless communication, WiFi, and telecommunication, etc. However, for a conventional patch antenna for millimeter wave communication, the performance is an issue with about only 5 dBi gain. Also, the large size of the on-chip patch antenna (e.g., 1.18 mm×0.89 mm for a 77 GHz application) and the antenna cost are problematic. Accordingly, new structures and methods are desired to solve the above problems.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1A:
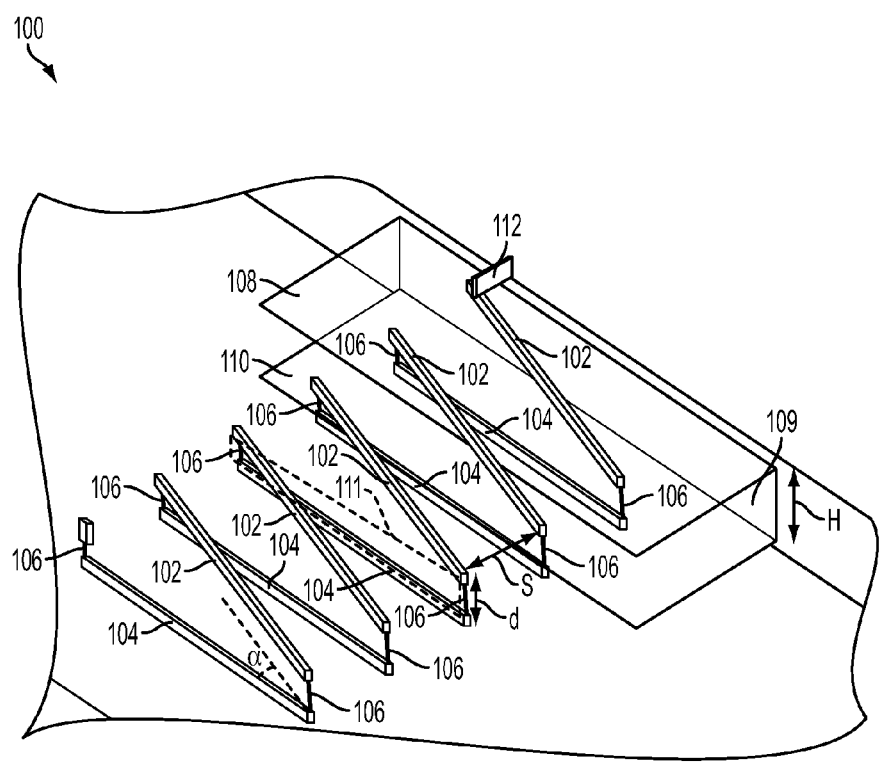
FIG. 1A is a schematic diagram showing an exemplary on-chip rectangular helix antenna according to some embodiments.
Figure 1B:
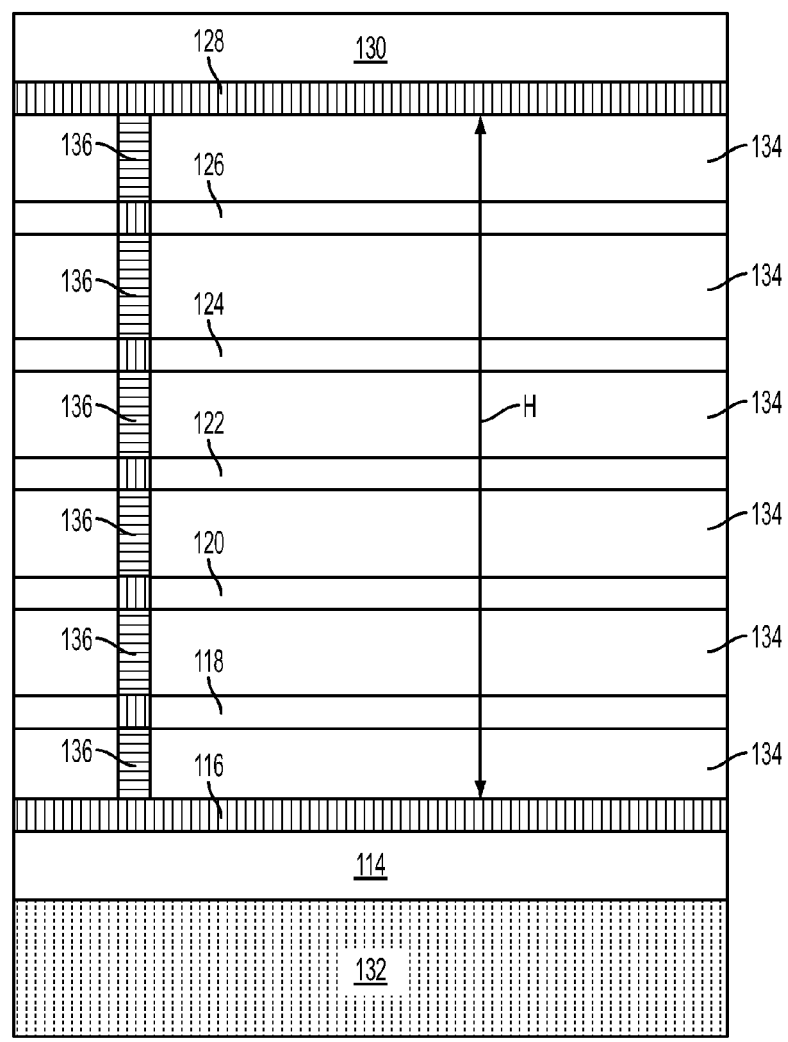
FIG. 1B is a schematic diagram showing exemplary layers of an integrated circuit for the on-chip rectangular helix antenna in FIG. 1A according to some embodiments.

FIG. 1A is a schematic diagram showing an exemplary on-chip rectangular helix antenna according to some embodiments. FIG. 1B is a schematic diagram showing exemplary layers of an integrated circuit for the on-chip rectangular helix antenna in FIG. 1A, according to some embodiments. In parts of the description below, elements of FIG. 1A and FIG. 1B are referenced together.

The rectangular helix antenna 100 in an integrated chip includes upper electrodes 102 disposed in a first metal layer, e.g., 126, lower electrodes 104 disposed in a second metal layer, e.g., 118, and side electrodes 106 connecting the upper electrodes 102 with the lower electrodes 104, respectively. In some embodiments, there is at least one metal layer, e.g., 120, 122, or 124, between the first metal layer, e.g., 126, and the second metal layer, e.g., 118.

The upper electrodes 102 are disposed at an angle ($\alpha$) with respect to the lower electrodes 104. The upper electrodes 102, the lower electrodes 104, and the side electrodes 106 form one continuous electrode spiraling around an inner shape of a rectangular bar. In some embodiments, the side electrodes 106 are vias, e.g., 136, connecting the upper electrodes 102 in the first metal layer, e.g., 126 and the lower electrodes 104 in the second metal layer, e.g., 118

A first ground plane 108 is disposed in a third metal layer, e.g., 128, above the upper electrodes 102 in the first metal layer, e.g., 126. A second ground plane 110 is disposed in a fourth metal layer, e.g., 116, below the lower electrodes 104 in the second metal layer, e.g., 118. The first ground plane 108 and the second ground plane 110 are connected by a vertical ground plane 109 to form a folded grounding. In some embodiments, the folded grounding has an area at least three times of a rectangular area 111 (i.e., the helix area) of the rectangular helix antenna 100, e.g., 4-5 times helix area, as ground. The height (H) between the first ground plane 108 and the second ground plane 110 is 10-17 μm in some embodiments using a Complementary Metal-Oxide-Semiconductor (CMOS) process. The feed line 112 connects the rectangular helix antenna 100 to a transmitter or receiver circuit.

Figure 1C:
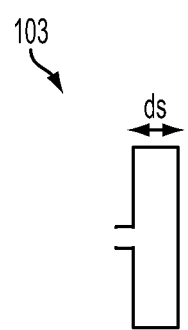
FIG. 1C is a schematic diagram showing an exemplary folded dipole antenna design according to some embodiments.
Figure 1D:
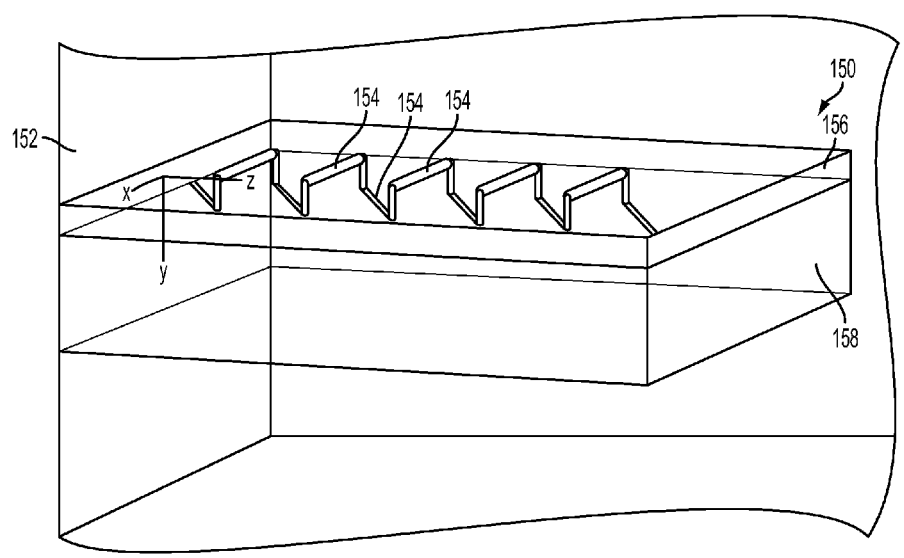
FIG. 1D is a schematic diagram showing an exemplary off-chip grounding for an on-chip rectangular helix antenna according to some embodiments.

In other embodiments, instead of the folded grounding in FIG. 1A that includes 108, 109, and 110, an off-chip grounding 152, disposed at the side of the integrated chip (that can be perpendicular in some embodiments), is used for the helix antenna structure, as shown in FIG. 1D.

In some embodiments, the rectangular helix antenna 100 is contained in an extended waveguide, e.g., a dielectric layer (e.g., $SiO_2$), as described below in FIG. 3. An on-chip helix antenna with extended $SiO_2$ can be implemented in a normal chip environment, and the performance can be improved using the waveguide. With larger/longer chip size than the actual on-chip antenna, that extra chip area could serve as the extended waveguide to improve the performance.

In the embodiment shown in FIG. 1B, an integrated circuit 101 that includes the rectangular helix antenna 100 has metal layers 116 (M1), 118 (M2), 120 (M3), 122 (M4), 124 (M5), 126 (M6), and 128 (top metal layer), implemented on an isolation layer 114 over a substrate 132. Inter-layer dielectric (ILD) layers 134 (or inter-metal dielectric (IMD)) and a passivation layer 130 are also shown. Metal layers can be connected vertically through vias 136. The fabrication process for the integrated circuit 101 is known in the art.

The rectangular helix antenna 100 can be implemented using M1 and top metal layer for the first ground plane 108 and the second ground plane 110, respectively. The vertical ground plane 109 can be implemented using vias and/or metal mesh (or by attaching a metal layer during packaging) to form the folded grounding by connecting the first ground plane 108 and the second ground plane 110. The upper electrodes 102 can be implemented using M6, while the lower electrodes 104 can be implemented using M2. The side electrodes 106 can be implemented using vias connecting the upper electrodes 102 and the lower electrodes 104.

The exemplary rectangular helix antenna 100 in FIG. 1A is a lateral antenna structure, the antenna 100 is capable of radiating electromagnetic wave radiation having a circular polarization (depending on the design) and high directivity/small radiation angle, e.g., about 90° or less. High directivity provides better resolution in many applications, e.g., multiple-input and multiple-output (MIMO), a vehicle radar, and time-space modulation, etc. With better directivity, the rectangular helix antenna 100 has relatively high gain. For example, a dipole antenna has a gain of about 4 dBi, a patch antenna has about 5-6 dBi, and the rectangular helix antenna 100 can have a gain of about 10 dBi.

In some embodiments, the rectangular helix antenna 100 has a relatively good bandwidth in that a carrier frequency and the antenna's bandwidth have a ratio of about 2:1, e.g., about 5 GHz bandwidth for a 10 GHz carrier frequency, compared to about 1 GHz bandwidth (10:1) of a patch antenna. The rectangular helix antenna 100 can have a circular polarization depending on the design that provides good reflectivity, less absorption, without a phasing issue of a linear polarization, multiple paths to overcome obstruction, and resistance to weather (e.g., rain or snow).

In one embodiment for a 77 GHz narrow band application, the rectangular helix antenna 100 has an area of about 0.714 mm$^2$, a directivity of 8.52 dBi, and a resolution (3 dB angle in degree) of about 97.8° (this can be improved by better impedance matching), compared to 1.08 mm$^2$, 6.1 dBi, and 180° of a patch antenna. Thus, the rectangular helix antenna 100 provides better performance compared with a patch antenna, and the rectangular helix antenna 100 uses 34% less chip area.

The design and size of a rectangular helix antenna can be determined by the following steps according to some embodiments. First, a single turn of the rectangular helix antenna is calculated to have a length, L of one wavelength ($\lambda$) Second, the spacing S between each turn of the helix is selected to have a relationship by the equation: $\text{Tan}^{-1}(S/L)=12°-14°$. Third, the size is fine tuned for the target result. For example if the radiation is not in the desired directional, the spacing S may be too large, and if the gain is too low, the spacing S may be too small. Also, the radiation impedance of the rectangular helix antenna is evaluated to determine which frequency has the biggest gain or response. For example, if the frequency is too high, the length L may be too small.

According to some embodiments, an on-chip rectangular helix antenna can be designed by the following steps. First, a single round of the rectangular helix antenna is calculated to be one wavelength ($\lambda$) in the layer that contains the antenna, e.g., SiO$_2$. Second, due to similar antenna behavior, the length (d) of side electrodes 106, e.g., 10-17 µm, is used as the side length (ds) of a folded dipole antenna design 103 in FIG. 1C that has the rectangular shape 111 for design considerations. Third, in the radiation direction, the polarization can be designed between linear polarization and circular polarization depending on the application, e.g., a circular polarization for Global positioning System using large enough side length (d), and a linear polarization for a vehicle radar with relatively small side length (d), etc. The width and size for side electrodes 106, e.g., vias, upper electrodes 102 and lower electrodes 104, e.g., metal lines, can be designed to fit the current density requirement of the desired antenna application to minimize energy loss and improve radiation efficiency.

FIG. 1D is a schematic diagram showing an exemplary off-chip grounding for an on-chip rectangular helix antenna according to some embodiments. An on-chip rectangular helix antenna structure 154, similar to the helix antenna in FIG. 1A, is shown with a dielectric layer 156 (e.g., SiO$_2$) on a substrate 158. For this implementation, an off-chip grounding 152, disposed at the side of the integrated chip 150 (that can be perpendicular in some embodiments), is used for the helix antenna structure 154, instead of folded grounding in FIG. 1A that includes 108, 109, and 110. The off-chip grounding 152 can comprise conductive material, e.g., metal. By using the off-chip grounding 152, the helix antenna structure 154 can utilize more metal layers, which would be otherwise used for the folded grounding in FIG. 1A, e.g., 108 and 110.

Figure 2:
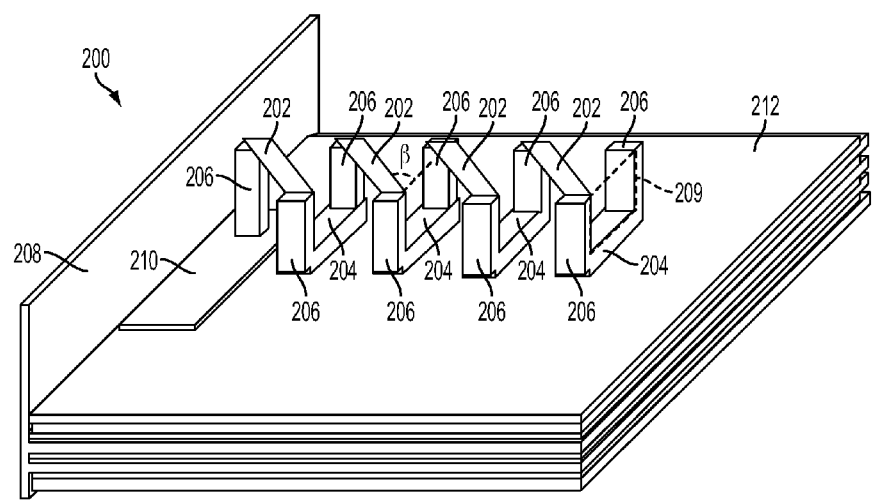
FIG. 2 is a schematic diagram showing another exemplary on-chip rectangular helix antenna implemented as a microelectromechanical system (MEMS) according to some embodiments.

FIG. 2 is a schematic diagram showing another exemplary on-chip rectangular helix antenna implemented as a microelectromechanical system (MEMS) according to some embodiments. The MEMS rectangular helix antenna 200 implemented on an integrated chip 212 includes upper electrodes 202 disposed above the integrated chip 212, lower electrodes 204 disposed over the integrated chip 212, and side electrodes 206 connecting the upper electrodes 202 with the lower electrodes 204, respectively.

The upper electrodes 202 are disposed at an angle ($\beta$) with respect to the plurality of lower electrodes 204. However, in other embodiments, the angle can be zero, i.e., the upper electrodes 202 can be parallel to the lower electrodes 204, and the side electrodes 206 can be inclined at an angle to connect each upper electrode 202 and lower electrode 204. The upper electrodes 202, the lower electrodes 204, and the side electrodes 206 form one continuous electrode spiraling around an inner shape of a rectangular bar. It should be noted that MEMS helix antenna does not have to be rectangular, and the inner shape of a bar can be a shape other than rectangular. For example, the bar could be circular, oval, elliptical, or other polygon shapes such as hexagon or octagon.

A ground plane 208 is disposed in a metal layer at the side of the integrated chip 212, which can be perpendicular in some embodiments. In some embodiments, the ground plane 208 has an area at least three times of a rectangular area 209 of the MEMS rectangular helix antenna 200, e.g., 4-5 times. In some embodiments, the lower electrodes 204 are disposed over a passivation layer of the integrated chip 212. The upper electrodes 202 and the lower electrodes 204 comprise metal, e.g., aluminum, copper, any other suitable metal or any combination thereof. A contact pad 210 connects the MEMS rectangular helix antenna 200 to a transmitter or a receiver in the integrated chip 212 or outside. In some embodiments, the side electrodes 206 comprise metal. (In some embodiments, the rectangular helix antenna 200 is contained in an extended waveguide, e.g., comprising a dielectric layer, such as 304 shown in FIG. 3.

An exemplary MEMS rectangular helix antenna 200 with a length of 1.165 mm, a height of 1.165 mm, a spacing of 0.59 mm, an area of 2.4 mm$^2$, showed a directivity of 11.1 dBi and a resolution of 48° (3 dB angle degree), compared to an exemplary on-chip rectangular helix antenna 100 (confined in a 10 µm SiO$_2$ layer) with a length of 1.34 mm, a height of 10 µm, a spacing of 0.106 mm, an area of 0.71 mm$^2$, that showed a directivity of 8.52 dBi and a resolution of 97.8°. The MEMS rectangular helix antenna 200 showed better performance in directivity and resolution having a larger size, but can be more expensive to fabricate depending on embodiments.

Figure 3:
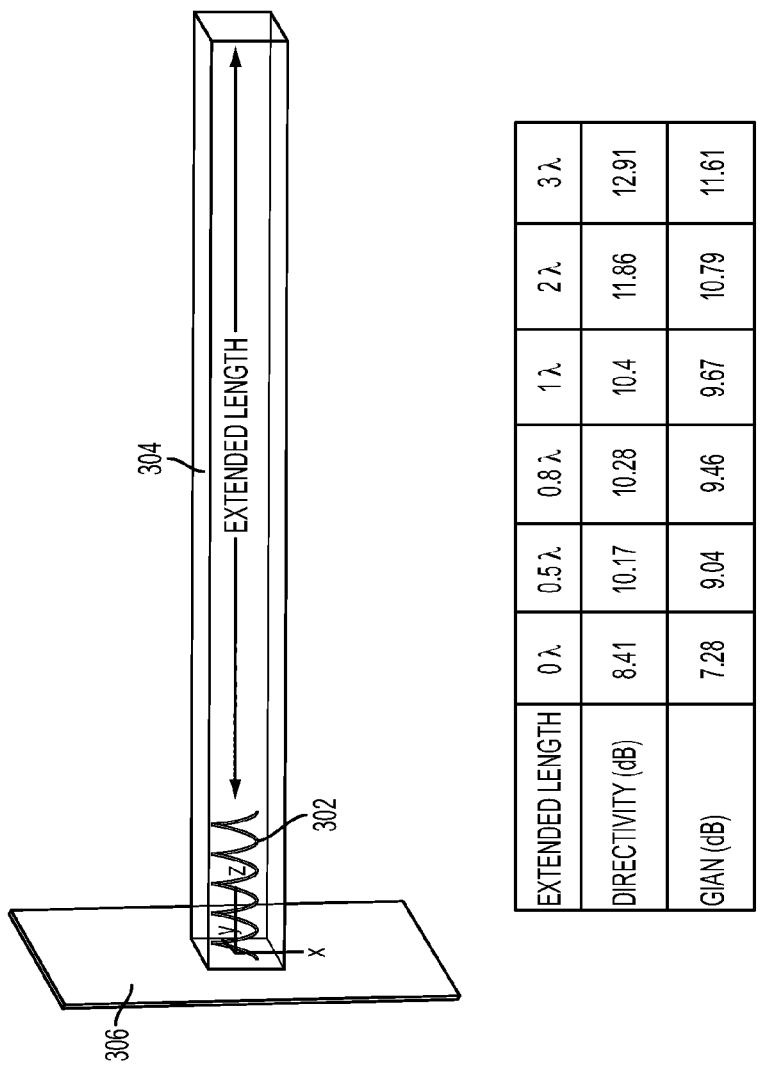
FIG. 3 is a schematic diagram showing an exemplary helix antenna implemented with a waveguide according to some on-chip embodiments.

FIG. 3 is a schematic diagram showing an exemplary helix antenna implemented with a waveguide according to some embodiments. A generic helix antenna 302 is shown inside a waveguide 304 that extends in the radiation direction of the helix antenna 302. The waveguide 304 improves performance in directivity and gain, and resolution. In some embodiments, the waveguide 304 comprises a dielectric layer, e.g., SiO$_2$. A generic ground 306 for the helix antenna 302 is also shown. The helix antenna 302 can be implemented in various ways, e.g., 100 in FIG. 1A and/or 200 in FIG. 2, etc., and the waveguide 304 can be implemented accordingly.

In FIG. 3, exemplary embodiments of the rectangular helix antenna 100 having extended SiO$_2$ waveguide show performance improvements as the extended length increases from 0 wavelength (λ) to 3λ, the directivity increases from 8.41 dB to 12.91 dB, and the gain increases from 7.28 dB to 11.61 dB.

According to some embodiments, a rectangular helix antenna in an integrated circuit includes upper electrodes disposed in a first metal layer, lower electrodes disposed in a second metal layer, and side electrodes connecting the upper electrodes with the lower electrodes, respectively. The upper electrodes are disposed at an angle with respect to the lower electrodes. The upper electrodes, the lower electrodes, and the side electrodes form one continuous electrode spiraling around an inner shape of a rectangular bar.

According to some embodiments, a micro-electromechanical system (MEMS) helix antenna implemented over an integrated chip includes upper electrodes disposed above the integrated circuit, lower electrodes disposed over the integrated chip, and side electrodes connecting the upper electrodes with the lower electrodes, respectively. The upper electrodes, the lower electrodes, and the side electrodes form one continuous electrode spiraling around an inner shape of a polygonal, circular, or elliptical bar.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different claims and/or different embodiments are within scope of the disclosure and will be apparent to those skilled in the art after reviewing this disclosure.

What is claimed is:

1. A rectangular helix antenna in an integrated circuit, comprising:
   a plurality of upper electrodes in a first metal layer;
   a plurality of lower electrodes in a second metal layer;
   a plurality of side electrodes connecting the upper electrodes with the lower electrodes;
   a first ground plane in a third metal layer above the first metal layer;
   a second ground plane in a fourth metal layer below the second metal layer; and
   a vertical ground plane connecting the first ground plane and the second ground plane,
   wherein
      the upper electrodes, the lower electrodes and the side electrodes form one continuous electrode spiraling around an inner shape of a bar,
      the continuous electrode extends in a first direction substantially perpendicular to the vertical ground plane over a substrate,
      the upper electrodes extend in a second direction substantially perpendicular to the first direction,
      the upper electrodes, the lower electrodes, and the side electrodes are embedded within a waveguide structure comprising a dielectric material,
      the substrate has a length extending in the first direction greater than a length the continuous electrode extends in the first direction, and
      the waveguide structure comprises a portion of the substrate in a region beyond the length of the continuous electrode in the first direction.

2. The rectangular helix antenna of claim 1, wherein the first ground plane, the second ground plane, and the vertical ground plane together form a folded grounding, and the folded grounding has an area at least three times greater than that of a cross sectional rectangular area of the rectangular helix antenna.

3. The rectangular helix antenna of claim 1, further comprising an off-chip grounding disposed at a side of the integrated circuit.

4. The rectangular helix antenna of claim 1, wherein the side electrodes comprise vias.

5. The helix antenna of claim 4, wherein the vias are angled with respect to the upper electrodes and to the lower electrodes.

6. The rectangular helix antenna of claim 1, wherein there is at least one metal layer between the first metal layer and the second metal layer.

7. The helix antenna of claim 1, wherein the waveguide structure has a length in a range from about one wavelength to about three wavelengths, and one length of one turn of the helix antenna is equal to one wavelength.

8. The helix antenna of claim 1, wherein the waveguide structure has a height from a bottom surface to a top surface of about 10 micrometers, and the upper electrodes, the lower electrodes, and the side electrodes are confined within the height of the waveguide structure.

9. The helix antenna of claim 1, wherein the waveguide structure extends in the first direction and has a length at least equal to the length the continuous electrode extends in the first direction.

10. A micro-electromechanical system (MEMS) helix antenna implemented over an integrated chip, comprising:
    a plurality of upper electrodes over the integrated chip, the upper electrodes being parallel to one another;
    a plurality of lower electrodes over the integrated chip, the lower electrodes being parallel to one another; and
    a plurality of side electrodes connecting the upper electrodes with the lower electrodes;
    wherein
       the sides electrodes are angled with respect to the upper electrodes and the lower electrodes,
       the upper electrodes, the lower electrodes, and the side electrodes form one continuous electrode spiraling around an inner shape of a bar,
       the upper electrodes, the lower electrodes, and the side electrodes are embedded within a waveguide structure comprising a dielectric material,
       the integrated chip has a length extending in a first direction greater than a length the continuous electrode extends in the first direction, and
       the waveguide structure comprises a portion of the integrated chip in a region beyond the length of the continuous electrode in the first direction.

11. The MEMS helix antenna of claim 10, further comprising an off-chip grounding disposed at a side of the integrated chip.

12. The MEMS helix antenna of claim 11, wherein the off-chip grounding has an area at least three times greater than that of a rectangular area of the MEMS helix antenna.

13. The MEMS helix antenna of claim 10, wherein the lower electrodes are over a passivation layer of the integrated chip.

14. The MEMS helix antenna of claim 10, further comprising a contact pad connecting the MEMS helix antenna to a transmitter or a receiver in the integrated chip.

15. The MEMS helix antenna of claim 10, wherein the inner shape of the bar is a rectangular, a hexagonal, or an octagonal shape.

16. The MEMS helix antenna of claim 10, wherein the upper electrodes, the lower electrodes, and the side electrodes form one continuous electrode spiraling around an inner shape of a circular, oval, or elliptical bar.

17. The MEMS helix antenna of claim 10, wherein the dielectric material of the waveguide structure comprises a silicon dioxide layer.

18. The MEMS helix antenna of claim 10, wherein the side electrodes comprise vias between a first metal layer and a second metal layer.

19. An integrated chip having a rectangular helix antenna, the rectangular helix antenna comprising:
a plurality of upper electrodes in a first metal layer; and
a plurality of lower electrodes in a second metal layer;
a plurality of side electrodes connecting the upper electrodes with the lower electrodes;
wherein
the upper electrodes are substantially parallel to the lower electrodes,
the side electrodes are angled with respect to the first metal layer and the second metal layer,
the upper electrodes, the lower electrodes, and the side electrodes form one continuous electrode over a substrate and spiraling around an inner shape of a rectangular bar,
the upper electrodes, the lower electrodes, and the side electrodes are embedded within a waveguide structure comprising a dielectric material,
the substrate has a length extending in a first direction greater than a length the continuous electrode extends in the first direction, and
the waveguide structure comprises a portion of the substrate in a region beyond the length of the continuous electrode in the first direction.

20. The integrated chip of claim 19, wherein the side electrodes are angled vias.

* * * * *